(12) United States Patent
Balakrishnan et al.

(10) Patent No.: US 9,812,530 B2
(45) Date of Patent: Nov. 7, 2017

(54) HIGH GERMANIUM CONTENT SILICON GERMANIUM FINS

(71) Applicant: International Business Machines Corporation, Armonk, NY (US)

(72) Inventors: Karthik Balakrishnan, New York, NY (US); John Bruley, Poughkeepsie, NY (US); Pouya Hashemi, White Plains, NY (US); Ali Khakifirooz, Los Altos, CA (US); John A. Ott, Greenwood Lake, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/068,601

(22) Filed: Mar. 13, 2016

(65) Prior Publication Data

US 2016/0197147 A1    Jul. 7, 2016

Related U.S. Application Data

(62) Division of application No. 14/479,252, filed on Sep. 5, 2014, now Pat. No. 9,324,843.

(51) Int. Cl.
*H01L 27/12* (2006.01)
*H01L 29/161* (2006.01)
(Continued)

(52) U.S. Cl.
CPC ............ *H01L 29/161* (2013.01); *H01L 21/18* (2013.01); *H01L 21/30604* (2013.01);
(Continued)

(58) Field of Classification Search
CPC ..... H01L 21/823807; H01L 21/823842; H01L 21/823814; H01L 29/161; H01L 27/0886;
(Continued)

(56) References Cited

U.S. PATENT DOCUMENTS 6,501,135 B1    12/2002  Krivokapic
7,550,370 B2    6/2009   Chen et al.
(Continued)

OTHER PUBLICATIONS

Jiang et al., "Ge-Rich (70%) SiGe Nanowire MOSFET Fabricated Using Pattern-Dependent Ge-Condensation Technique", IEEE Electron Device Letters, vol. 29, No. 6, pp. 595-598 (2008).
(Continued)

*Primary Examiner* — Phat X Cao
*Assistant Examiner* — Mohammad M Hoque
(74) *Attorney, Agent, or Firm* — Louis J. Percello; Otterstedt, Ellenbogen & Kammer, LLP

(57) ABSTRACT

Thermal condensation is employed to obtain a finned structure including strained silicon germanium fins having vertical side walls and a germanium content that may be high relative to silicon. A hard mask is used directly on a low-germanium content silicon germanium layer. The hard mask is patterned and fins are formed beneath the hard mask from the silicon germanium layer. Thermal condensation in an oxidizing ambient causes the formation of regions beneath the hard mask that have a high germanium content. The hard mask is trimmed to a target critical dimension. The regions beneath the hard mask and adjoining oxide material are subjected to reactive ion etch, resulting in the formation of high-germanium content fins with planar, vertically extending sidewalls.

15 Claims, 7 Drawing Sheets

(51) Int. Cl.
*H01L 29/66* (2006.01)
*H01L 29/78* (2006.01)
*H01L 21/306* (2006.01)
*H01L 21/311* (2006.01)
*H01L 21/324* (2006.01)
*H01L 29/06* (2006.01)
*H01L 21/18* (2006.01)
*H01L 27/088* (2006.01)
*H01L 29/10* (2006.01)

(52) U.S. Cl.
CPC ...... *H01L 21/31144* (2013.01); *H01L 21/324* (2013.01); *H01L 27/0886* (2013.01); *H01L 29/0649* (2013.01); *H01L 29/0657* (2013.01); *H01L 29/1054* (2013.01); *H01L 29/66818* (2013.01); *H01L 29/785* (2013.01)

(58) Field of Classification Search
CPC . H01L 29/0657; H01L 29/1054; H01L 21/18; H01L 29/66818; H01L 29/785; H01L 21/30604; H01L 21/31144; H01L 21/324; H01L 29/0649
USPC .......................................... 257/347
See application file for complete search history.

(56) References Cited

U.S. PATENT DOCUMENTS

| | | | |
|---|---|---|---|
| 7,566,630 B2 | 7/2009 | Vo | |
| 8,048,723 B2 | 11/2011 | Chang et al. | |
| 8,211,772 B2 | 7/2012 | Kavalieros et al. | |
| 2009/0294919 A1* | 12/2009 | Stephens | H01L 21/02057 257/632 |
| 2011/0147811 A1* | 6/2011 | Kavalieros | H01L 29/66795 257/288 |
| 2011/0193178 A1* | 8/2011 | Chang | H01L 29/7853 257/408 |
| 2013/0023092 A1 | 1/2013 | Oda et al. | |
| 2013/0105867 A1 | 5/2013 | Wang et al. | |
| 2013/0193514 A1 | 8/2013 | Loubet et al. | |
| 2013/0200483 A1 | 8/2013 | Tung | |
| 2014/0011328 A1 | 1/2014 | Bedell et al. | |
| 2014/0030876 A1 | 1/2014 | Flachowsky et al. | |
| 2014/0193963 A1 | 7/2014 | Godet et al. | |
| 2015/0104948 A1 | 4/2015 | Patil et al. | |
| 2015/0129968 A1* | 5/2015 | Lin | H01L 27/1207 257/351 |
| 2015/0228648 A1* | 8/2015 | Chi | H01L 27/0886 257/401 |
| 2015/0279973 A1* | 10/2015 | Akarvardar | H01L 29/1054 438/283 |
| 2016/0071956 A1 | 3/2016 | Balakrishnan et al. | |

OTHER PUBLICATIONS

Kazior et al. "A high performance differential amplifier through the direct monolithic integration of InP HBTs and Si CMOS on silicon substrates." Digest of IEEE MTT-S International Microwave Symposium (MTT '09) pp. 1113-1116 (2009).

Smith et al., "Dual channel FinFETs as a single high-k/metal gate solution beyond 22nm node", In Digest of IEEE International Electron Devices Meeting (IEDM), pp. 1-4 (2009).

Tezuka et al., "Structural analyses of strained SiGe wires formed by hydrogen thermal etching and Ge-condensation processes", Applied Physics Letters 94, pp. 081910-1 to 081910-3, (2009).

Liaow et al., "Investigation of silicon-germanium fins fabricated using germanium condensation on vertical compliant structures", Applied Physics Letters 87, pp. 262104-1 to 262104-3 (2005).

"Characterization of 7-nm-thick strained Ge-on-insulator layer fabricated by Ge condensation technique", Tezuka et al., Applied Physics Letters vol. 83, No. 17 Oct. 27, 2003, pp. 3516-3518 plus cover.

List of IBM Patents or Patent Applications Treated As Related.

* cited by examiner

HIGH GERMANIUM CONTENT SILICON GERMANIUM FINS

CROSS-REFERENCE TO RELATED APPLICATIONS

This patent application is a divisional of U.S. patent application Ser. No. 14/479,252 filed Sep. 5, 2014, entitled "HIGH GERMANIUM CONTENT SILICON GERMANIUM FINS." The complete disclosure of the aforementioned U.S. patent application Ser. No. 14/479,252 is expressly incorporated herein by reference in its entirety for all purposes.

FIELD

The present disclosure relates to the physical sciences, and, more particularly, to non-planar structures employed in FinFET devices and methods of fabrication thereof.

BACKGROUND

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

SUMMARY

Principles of the present disclosure provide an exemplary fabrication method that includes obtaining a structure comprising a silicon germanium layer having a first germanium concentration and an electrically insulating layer adjoining the silicon germanium layer. A hard mask is formed on the silicon germanium layer and then patterned. A silicon germanium first fin is formed from a portion of the silicon germanium layer beneath the patterned hard mask. The step of causing thermal condensation in an oxidizing ambient of the silicon germanium first fin is performed to form a germanium-containing region beneath the patterned hard mask having a second germanium concentration higher than the first germanium concentration and an oxide region adjoining the germanium-containing region. The patterned hard mask is trimmed, thereby forming a hard mask fin adjoining the germanium-containing region. The method further includes removing the oxide region adjoining the germanium-containing region and anisotropically etching the germanium-containing region, thereby forming a germanium-containing second fin having planar, vertically extending sidewalls.

A method for fabricating a finned structure including germanium-containing fins on an electrically insulating layer includes selecting a target critical dimension for a plurality of germanium-containing fins and obtaining a structure including a substrate layer, a silicon germanium layer consisting essentially of $Si_{1-x}Ge_x$ where x is less than 0.5, an electrically insulating layer between and adjoining the substrate layer and the silicon germanium layer, and a hard mask directly on the electrically insulating layer. The method further includes patterning the hard mask to form a hard mask fin pattern having a critical dimension exceeding the target critical dimension and forming an array of parallel silicon germanium first fins from the silicon germanium layer beneath the patterned hard mask. Germanium-containing regions consisting essentially of $Si_{1-y}Ge_y$ where y is greater than 0.75 and oxide regions adjoining the germanium-containing regions are formed by thermal condensation in an oxidizing ambient. The patterned hard mask is trimmed, thereby forming parallel hard mask fins having the target critical dimension and adjoining the germanium-containing regions. The oxide regions adjoining the germanium-containing regions are removed and the germanium-containing regions are anisotropically etched, thereby forming germanium-containing second fins having planar, vertically extending sidewalls and the target critical dimension from the germanium-containing region.

An exemplary finned structure includes a substrate layer, an electrically insulating layer on the substrate layer, and a plurality of parallel germanium-containing fins on the electrically insulating layer. The fins have vertical, planar side walls and consist essentially of $Si_{1-y}Ge_y$ where y is between 0.8-1. Each of the fins has a width of eight (8) nanometers or less.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Finned structures, including devices made from such finned structures, and fabrication methods as disclosed herein can provide substantial beneficial technical effects. For example, one or more embodiments may provide one or more of the following advantages:

High channel mobility and current drive;
High germanium content in fins with vertical sidewalls;
High performance logic pFET feasible;
Integratable with FinFET CMOS process flow.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. The exemplary processes discussed below relate to fabrication of finned structures from SOI substrates that can be subsequently processed to form electronic devices. FIGS. 1-9 illustrate exemplary steps that may be performed sequentially in fabricating structures having fins with a high germanium content, it being appreciated that additional steps are employed in some embodiments to form structures such as source and drain regions and gate stacks. Fabrication may commence with a partially completed structure, in which case one or more of the steps described below could be omitted.

Figure 1:
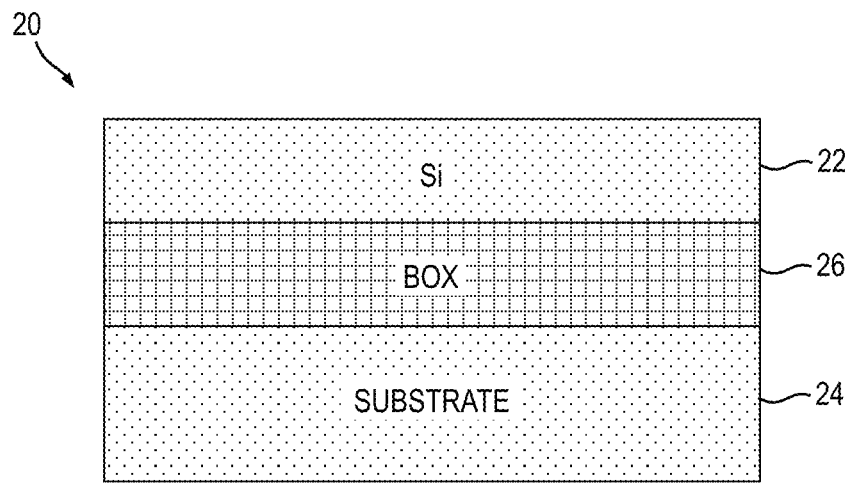
FIG. 1 is a schematic sectional illustration of a silicon on insulator substrate.

A SOI substrate 20 comprised of essentially undoped crystalline silicon is employed for forming a finned structure as described hereafter, it being appreciated that standard silicon substrates may have a very low level of p-doping. The substrate may be in the form of a wafer. As shown in FIG. 1, the substrate 20 includes a silicon (SOI) layer 22 (4-20 nm in thickness, with 6-8 nm preferred)], a substrate layer 24 that functions as a handle, and an electrically insulating layer 26 such as a buried oxide (BOX) layer. The electrically insulating layer 26 in one exemplary embodiment is a high quality silicon dioxide layer that is thermally grown, though other buried insulators such as boron nitride (BN) and aluminum oxide ($Al_2O_3$) may alternatively be employed in some embodiments. High quality buried oxides are generally characterized by relatively low interface trap densities ($D_{it}$).

Figure 2:
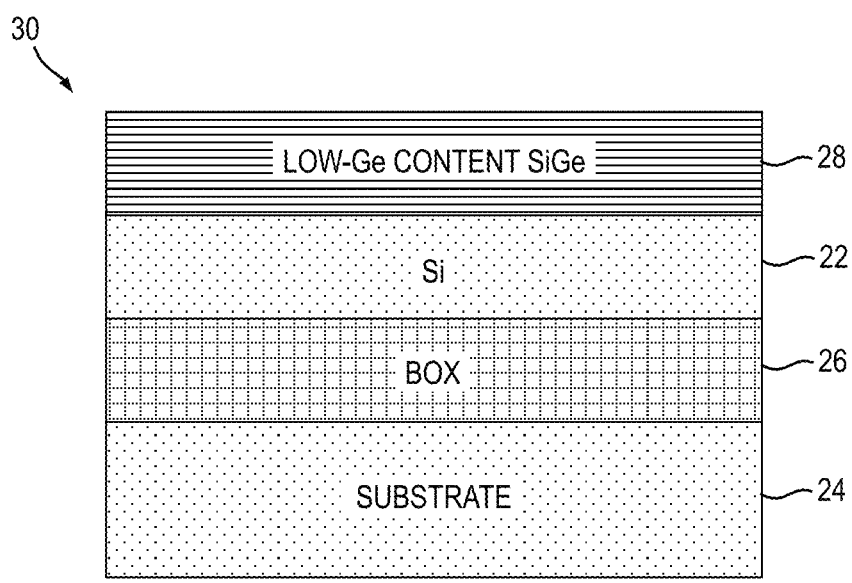
FIG. 2 is a schematic sectional illustration of the structure shown in FIG. 1 following deposition of a low germanium content silicon germanium layer.

A layer 28 of silicon germanium having a first germanium content is grown on the silicon layer 22. Various epitaxial processes known to the art can be employed for growing this layer. Exemplary epitaxial growth processes that are suitable for use in forming the silicon germanium layer 28 include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Although higher temperature typically results in faster deposition, the faster deposition may result in crystal defects and film cracking. The silicon germanium layer 28 can, for example, consist essentially of $Si_{1-x}Ge_x$ with $0.25<x<0.5$. The germanium and silicon precursors (e.g. germane and silane) are introduced in the proper ratios to obtain the targeted germanium content of the layer 28. The thickness of the layer 28 corresponds to the desired height of the fins to be ultimately formed on the substrate. The critical thickness of the silicon germanium layer 28 grown on the silicon layer 22 is inversely proportional to its germanium content. In other words, the silicon germanium layer 28, if below a certain critical thickness, will be essentially dislocation-free. Fin height to be obtained in further processing described below is limited by the critical thickness of the starting silicon germanium layer 28. Accordingly, taller fins can be obtained by using a silicon germanium layer having a germanium content in the lower end of the range. Fin heights in some embodiments range between 10-60 nm. The structure 30 shown in FIG. 2 is obtained once the epitaxial deposition process has been completed.

Figure 3:
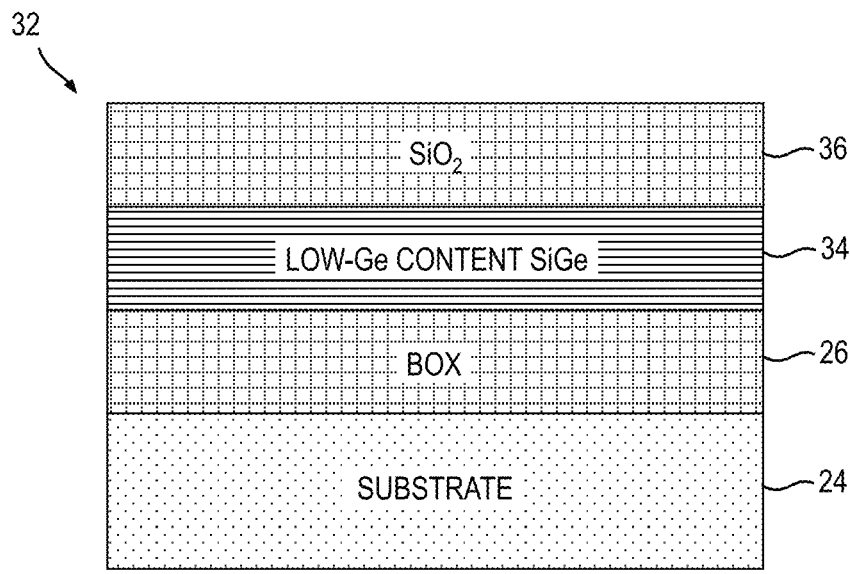
FIG. 3 is a schematic sectional illustration of the structure shown in FIG. 2 following thermal condensation.
Figure 4:
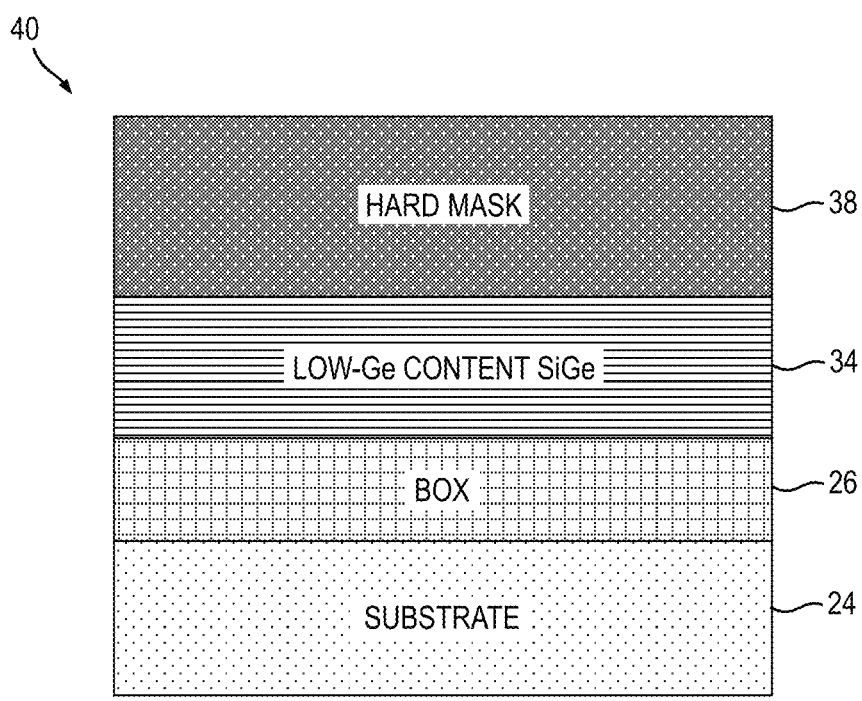
FIG. 4 is a schematic sectional illustration of the structure shown in FIG. 3 following hard mask deposition over a low germanium content silicon germanium layer.

A first thermal condensation process is conducted in oxygen-containing ambient with argon, helium or nitrogen ($O_2$ concentration 0.1-50%) to form the structure 32 shown in FIG. 3. The temperature is maintained between 750-1200° C. for ten (10) minutes to several hours depending on temperature and oxygen content. Oxidation and condensation happen at the same time. Upon annealing the structure 30, the germanium diffuses into the silicon layer 22. At the same time, the silicon in the silicon germanium layer 28 oxidizes at the surface of the silicon germanium layer 28, forming silicon oxide. Silicon is preferentially oxidized compared to the germanium in the layer. While the silicon oxidizes it is consumed to form silicon dioxide, increasing the germanium content at the surface of the remaining portion of the layer 28. Due to the resulting germanium gradient, the germanium tends to diffuse into a region of lower germanium concentration, including the silicon layer 22. Accordingly, the germanium diffuses toward the center of the structure 30, whereas the silicon diffuses in the direction of the surface of the structure, where it is consumed. The process accordingly increases the germanium content of the region that ultimately comprises one or more fins and forms an oxide on the resulting structure 32. In other words, the condensation process in the oxidizing ambient cause the diffusion of germanium from the silicon germanium layer 28 into the silicon layer 22, forming a new silicon germanium layer 34 having a germanium content that is between 0.20-0.40 ($Si_{1-x}Ge_x$ where x is between 0.2 and 0.4)) in one or more embodiments and consumption of silicon in the silicon germanium layer 28 to form silicon dioxide. As discussed above, tall first fins 48 can be obtained without exceeding the critical thickness of a silicon germanium layer by limiting the germanium content thereof. A silicon dioxide layer 36 layer adjoins on the new silicon germanium layer 34 of the resulting structure 32. Critical thickness of a blanket silicon germanium layer grown on silicon is dependent on the lattice constants of silicon germanium and silicon. SiGe has a higher lattice constant than silicon. Accordingly, growing SiGe on Si will lead to compressive strain in the SiGe. If the SiGe layer is thick enough, it will have enough energy to release the strain by forming dislocations or stacking faults. The higher the SiGe content, the higher the lattice mismatch and the lower the critical thickness under which no relaxation takes place.

The newly formed silicon germanium layer 34 may or may not have the same germanium content as the originally formed silicon germanium layer 28. The thermal silicon dioxide layer 36 is then removed. Such removal may be effected by a selective etching process using, for example, buffered hydrofluoric acid (HF). A hard mask 38 is deposited on the silicon germanium layer 34 to form the structure 40 shown in FIG. 4. A silicon nitride ($Si_3N_4$) layer is deposited via CVD, PECVD, sputtering, or other suitable technique in some embodiments, forming the hard mask 38.

Figure 5A:
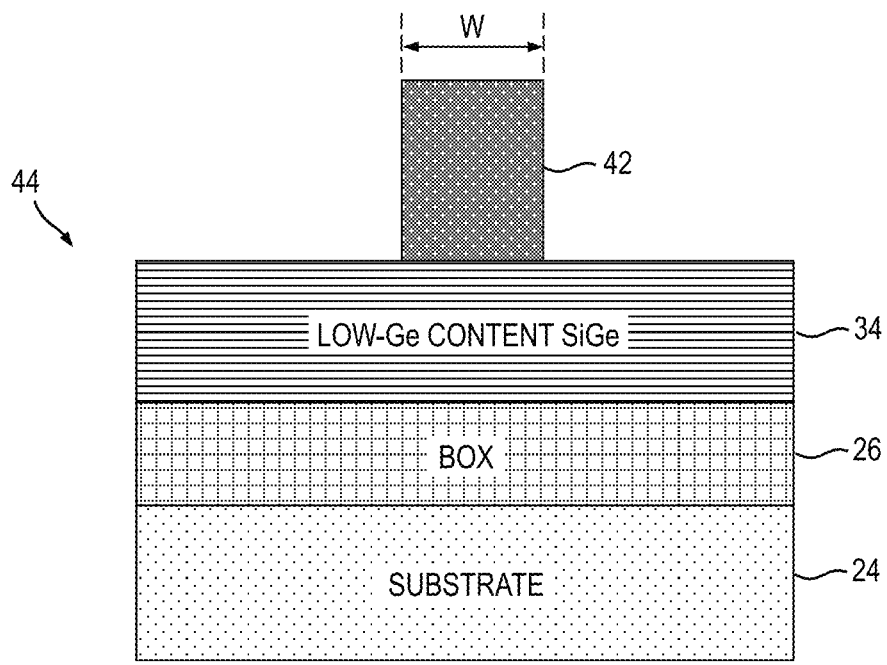
FIG. 5A is a schematic sectional illustration showing the structure of FIG. 4 following patterning of the hard mask into a fin pattern.
Figure 5B:
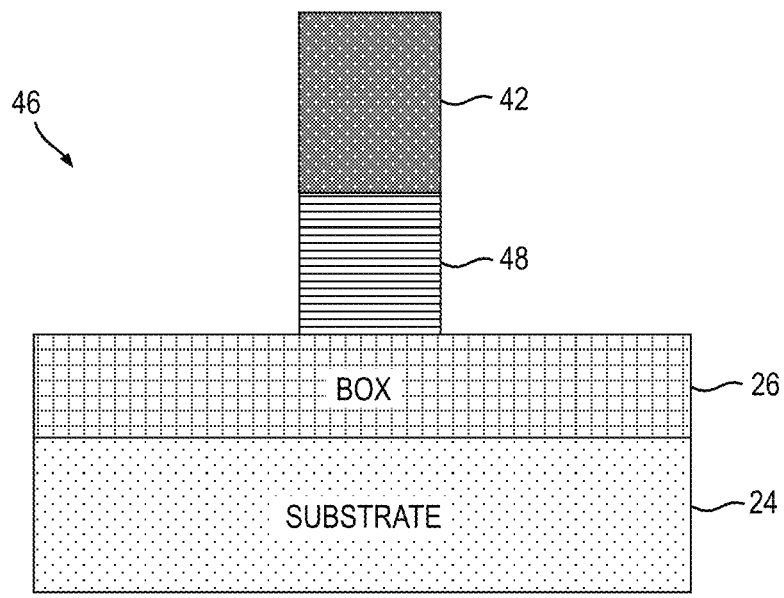
FIG. 5B is a schematic sectional illustration showing the structure of FIG. 5A following removal of portions of the silicon germanium layer unprotected by the hard mask.

Referring to FIGS. 5A and 5B, the hard mask 38 is patterned to form rows of nitride fins 42 on the silicon germanium layer 34. A lithography process may be employed to effect such patterning. Channels formed in a photoresist (not shown) expose selected portions of the underlying hard mask. The selected portions of the hard mask are then removed, transferring the photoresist pattern through the hard mask 38. Plasma etch processes familiar to those of skill in the art can be employed to form the structure 44 shown in FIG. 5A. The critical dimension (CD) of the fin pattern formed in the hard mask 38 (shown as W in FIG. 5A) is larger than the critical dimension of the high germanium content fins 82 that are formed later in the process, as further described below. In some embodiments, the hard mask CD is as narrow as 12-20 nm. As shown in FIG. 5B, the silicon germanium layer 34 is subjected to reactive ion etch (RIE) to remove the portions of the layer between the nitride fins 42, thereby forming a structure 46 including silicon germanium fins 48 having a low germanium content relative to the silicon germanium fins 82 obtained later in the fabrication process. The widths of the silicon germanium fins 48 are also greater than the critical dimensions(s) (width(s)) of the subsequently formed high germanium content fins 82.

Figure 6A:
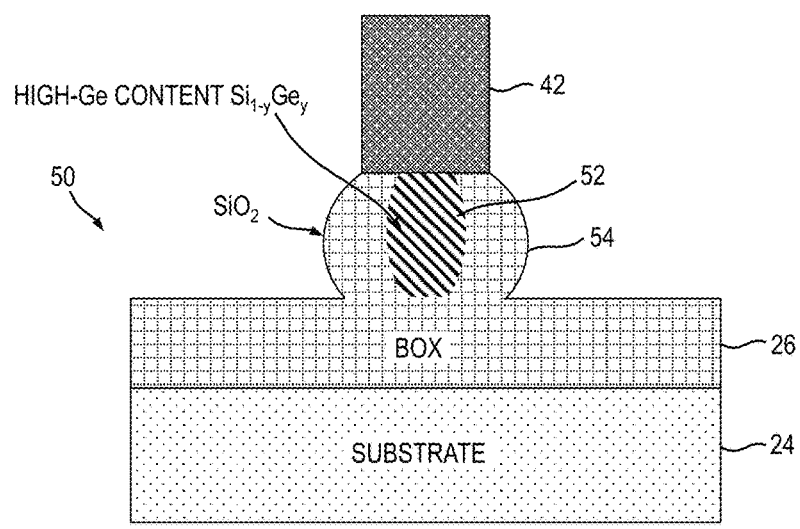
FIG. 6A is a schematic sectional illustration of the structure shown in FIG. 5B following a second thermal condensation in which a region having high germanium content is formed beneath the patterned hard mask.
Figure 6B:
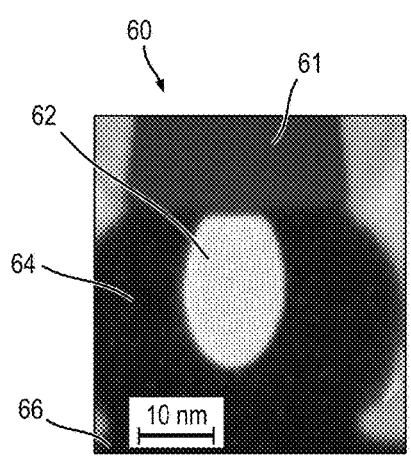
FIG. 6B is a sectional view of an exemplary structure obtained following the exemplary process of FIGS. 1-6B.
Figure 6C:
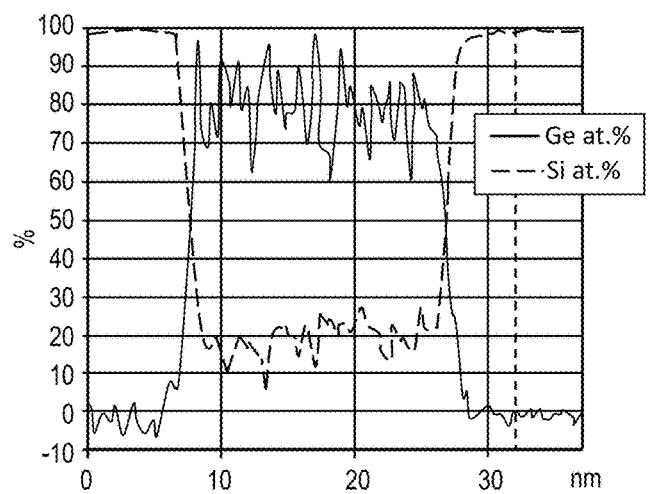
FIG. 6C is a graph showing percentages of silicon and germanium of the exemplary structure shown in FIG. 6B.
Figure 8:
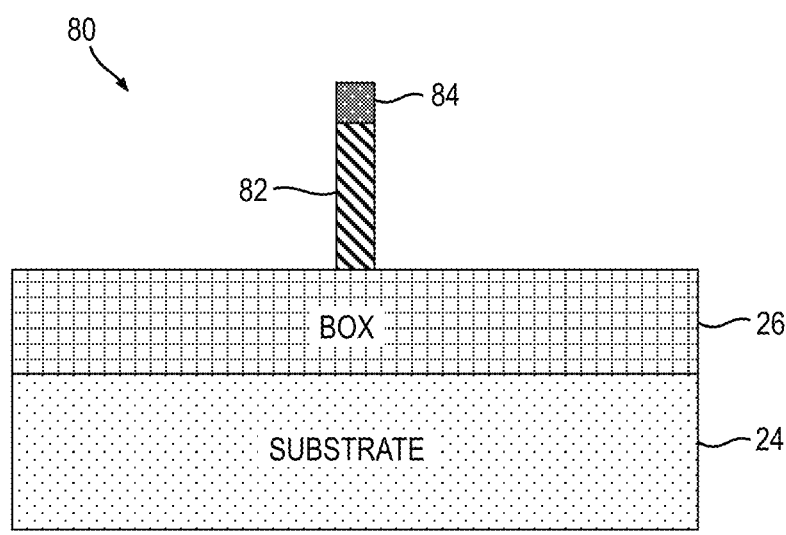
FIG. 8 is a schematic sectional illustration showing the structure shown in FIG. 7 following silicon oxide removal and etching of the region having a high germanium content.

A second thermal condensation process is conducted in an oxidizing ambient subsequent to the formation of the structure 46 shown in FIG. 5B. The oxidation is conducted between 750-900° C. The temperatures maintained during the second thermal condensation depend on the final germanium content that is desired for the fins 82 (FIG. 8). The melting temperatures associated with silicon germanium vary with the germanium content. Greater germanium content is associated with lower melting temperatures. If condensation is performed to obtain a pure germanium region, which melts at 938° C., the temperature should be maintained below 900° C. If, for example, a silicon germanium region containing eighty percent (80%) germanium is targeted, the temperature could be slightly higher. The temperature is maintained in the selected range between one (1) minute and sixty (60) minutes, with 5-30 minutes being typical in dry oxygen. In some embodiments, the starting temperature can be higher, decreasing to a lower temperature range as the germanium content of the targeted region increases. FIG. 6A provides a schematic illustration of an exemplary structure 50 obtained following the second condensation. The structure 50 includes a region 52 having a germanium content that is high relative to silicon, namely $Si_{1-y}Ge_y$, where in one or more embodiments, y is at least 0.75. In one or more embodiments, y is in the range of 0.8 to 1. A silicon dioxide region 54 is also formed beneath the nitride fins 42 outside and adjoining the germanium-containing region 52. FIG. 6B shows a portion of a structure 60 obtained following the steps as described above, including a portion of a nitride fin 61, a region 62 beneath the fin 61 having a high germanium content, and a silicon dioxide region 64 adjoining the high-Ge region 62 as well as the nitride fin 61 and the electrically insulating (BOX) layer 66 of the substrate. FIG. 6C shows the silicon and germanium content of the regions 62, 64 of the structure 60. It is evident that the germanium concentration of the region 62 greatly exceeds the silicon concentration thereof in the exemplary embodiment.

Figure 7:
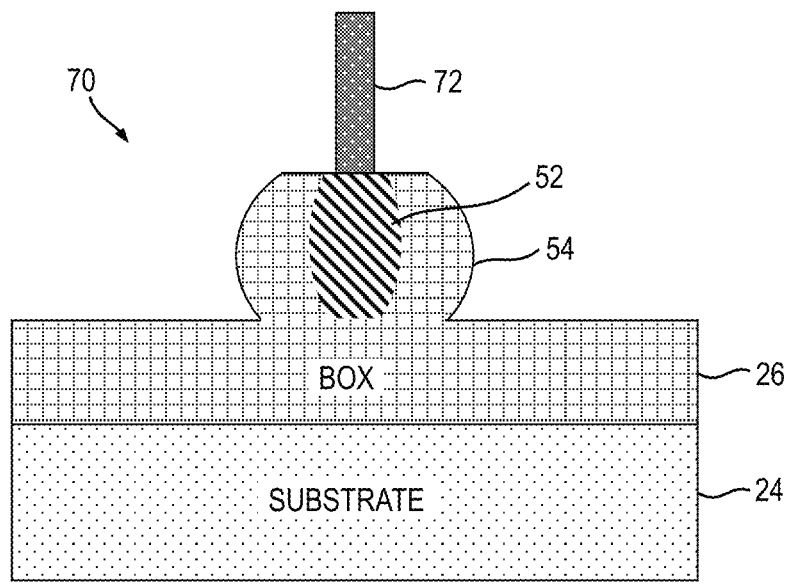
FIG. 7 is a schematic sectional illustration showing the structure shown in FIG. 6A following an isotropic wet etch process.

FIG. 7 schematically shows a structure 70 obtained following the step of trimming the nitride fins 42 of the structure shown in FIG. 6A. An isotropic wet process is employed in one or more embodiments to trim the nitride fins 42 to the target critical dimension of the subsequently formed germanium-containing fin. As shown in the figure, the resulting nitride fins 72 are thinner than the maximum widths of the adjoining germanium-containing regions 52.

The structure 70 is subjected to top down, reactive ion etching (ME) to remove the oxide region 54 and to trim the silicon germanium region 52 to the target critical dimension without undercutting the germanium-containing region beneath the nitride fin. Two step and one step processes, both of which are familiar to those of skill in the art, may be employed to obtain the structure 80. An oxide timed RIE is conducted in some embodiments. Silicon germanium ME endpoint detection is employed in some embodiments. Both silicon dioxide and silicon germanium can be simultaneously subjected to ME in a one step procedure, using germanium detection as an endpoint to minimize oxide loss, in some embodiments. The side walls of the germanium-containing regions 52 formed by condensation as described above are generally convex. Semiconductor fins having non-planar sidewalls such as the curved side walls of the germanium-containing regions 52 may suffer from electrostatic issues. The trimming of the germanium-containing regions 52 using an anisotropic etch technique such as RIE provides a structure 80 including germanium-containing fins 82 having planar sidewalls that extend vertically from the electrically insulating layer 26. Such a structure is shown in the schematic illustration provided in FIG. 8. The anisotropic etch is discontinued at or within the electrically insulating layer 26 using techniques familiar to those of skill in the art, such as employing a timed etch that stops before a significant portion of the electrically insulating layer 26 is removed. The electrically insulating layer 26 preferably remains substantially intact on the substrate following removal of the oxide region 54 and trimming of the germanium-containing region 52. The entireties of the germanium-containing fins 82, like the regions 52 from which they are formed, have a high germanium content. The nitride fins 72 are reduced in size during oxide ME and silicon germanium RIE. Each germanium-containing fin 82 of the structure 80 obtained accordingly includes a nitride cap 84 that remains following loss of a portion of the nitride fins 72.

Figure 9:
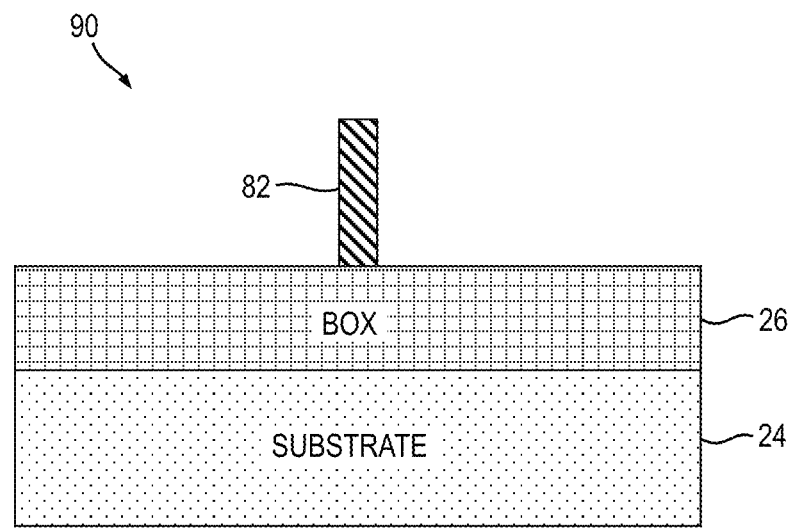
FIG. 9 is a schematic sectional illustration showing the structure shown in FIG. 8 following hard mask removal.

The remaining portions of the nitride cap 84 are stripped using hot phosphoric acid or other suitable stripping technique to obtain the structure 90 shown in FIG. 9. The structure 90 includes the substrate layer 24, the electrically insulating layer 26, and rows of silicon germanium fins 82 adjoining the electrically insulating layer 26. The entireties of the fins 82 consist essentially of silicon germanium ($Si_{1-y}Ge_y$) where y is at least 0.75. The side walls of the fins 82 are vertical and planar throughout their lengths. Once the structure 90 has been obtained, portions of the fins 82 can be employed as channel regions of devices such as non-planar pFETs that benefit from higher carrier mobility and current drive due to the high germanium content.

Figure 10:
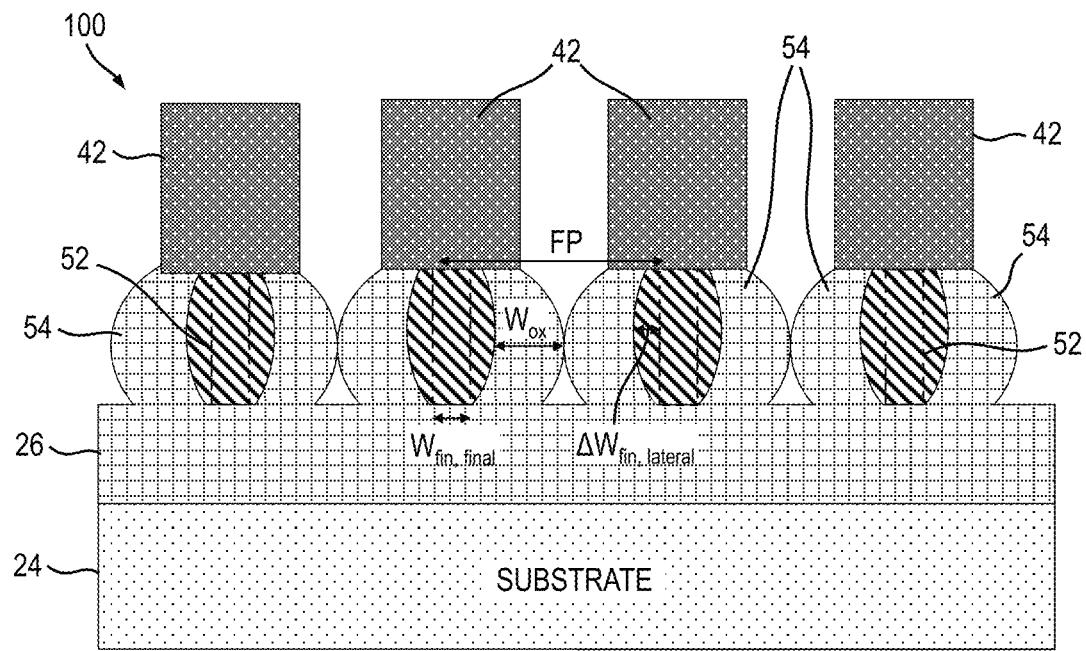
FIG. 10 is a schematic sectional illustration similar to FIG. 6A showing multiple regions of high germanium content and exemplary dimensions.

FIG. 10 provides a schematic illustration of a structure 100 obtained following the steps described above with respect to FIGS. 1-6A. The same reference numerals employed in FIG. 6A are used to designate similar elements present in the structure 100. Exemplary dimensions are indicated in FIG. 10. The fin pitch FP is defined by the fin pattern obtained following patterning of the structure discussed above with respect to FIGS. 5A and 5B. It is defined by lithography. Fin pitch is understood as the distance from one point of the fin to the same point on the next fin. The fin pitch FP is a function of the final silicon germanium fin width $W_{fin,final}$, the width $W_{ox}$ of the silicon dioxide region 54 formed around the silicon germanium region 52, and the width $\Delta W_{fin,lateral}$ of the portions of silicon germanium material in the silicon germanium region extending beyond the final fin width. Specifically, the minimum fin pitch necessary to fabricate the structure $FP_{min}=W_{fin,final}+2W_{ox}+2\Delta W_{fin,lateral}$. In one exemplary embodiment, $FP_{min}=8$ nm+2×8 nm+2×4 nm=40 nm. The sidewall oxide $W_{ox}$ is as narrow as six nanometers in some embodiments. Fin height is determined by the thickness of the second silicon germanium layer 34 (formed by condensation of layer 28). Fin pitch is between 25 nm and 100 nm and fin height is between 10 and 60 nm in one or more embodiments.

Transistors can be fabricated from the structures obtained using processing techniques applicable to silicon germanium structures. For example, ion implantation can take place while a portion of the silicon germanium fin 82 to be used as a channel region is protected by a dummy gate (not shown), thereby implanting a source region to achieve source target doping. The dummy gate can then be removed and the channel region implanted with ions while the source and drain regions are protected by a dielectric layer (not shown). Alternatively, doped source and drain regions (not shown) could be epitaxially grown on exposed channel surfaces on both sides of the channel. Transistor fabrication techniques and materials are employed that are compatible with fins having a high germanium content, it being appreciated that germanium melts at temperatures that are lower than silicon.

Figure 11:
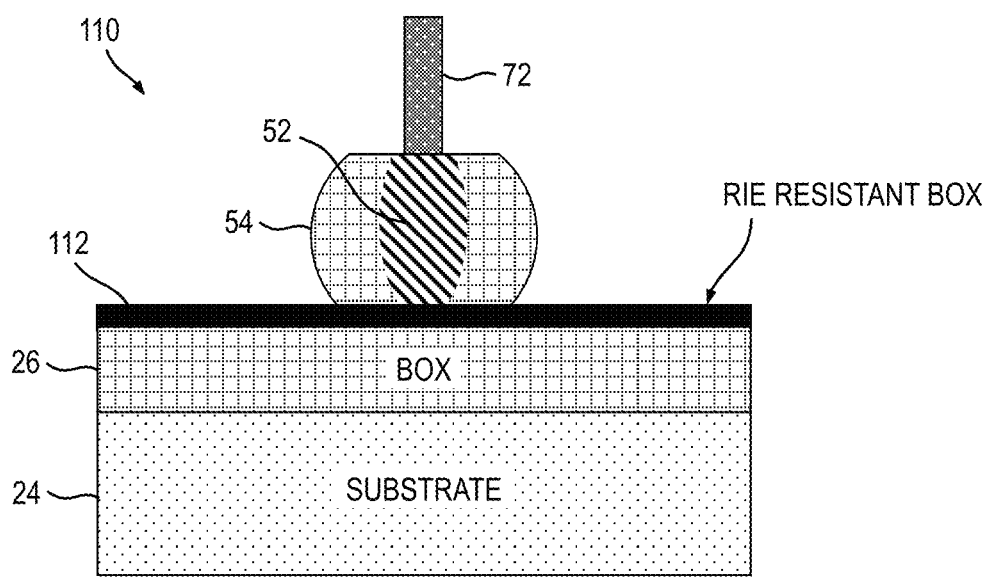
FIG. 11 is a schematic sectional illustration showing an alternative structure obtained using a RIE resistant layer.

In an alternative embodiment, the electrically insulating layer includes a plurality of layers. A structure 110 as shown in FIG. 11 can accordingly be obtained. The structure 110 is similar to that shown in FIG. 7 and is fabricated using techniques as described with respect to FIGS. 2-6. The starting structure (not shown) would be the same as that shown in FIG. 1 with the exception of an additional layer provided between the silicon dioxide layer 26 and the silicon layer 22. The same numerals are employed in FIG. 11 to designate similar elements present in the structures described above. In an exemplary embodiment, the electrically insulating layer includes a silicon dioxide layer 26 and a layer 112 exhibiting high etch resistance such as boron nitride (BN), hafnium oxide ($HfO_2$) or aluminum oxide ($Al_2O_3$). This layer 112 is formed during the starting substrate manufacturing process and is part of the BOX (buried oxide) layer. By including at least one layer having high etch resistance immediately beneath the silicon germanium region 52, the RIE process employed to remove the silicon dioxide regions 54 and to form silicon germanium fins corresponding in width to the trimmed hard mask is less likely to cause formation of recesses within the electrically insulating layer. Further processing is employed to remove the hard mask layer to form a structure comprising an array of parallel silicon germanium fins (not shown) having a high germanium content on the layer 112. Buried bi-layer insulators within silicon substrates and fabrication methods therefor are known to those of skill in the art.

Given the discussion thus far and with reference to the exemplary embodiments discussed above and the drawings, it will be appreciated that, in general terms, an exemplary fabrication method includes obtaining a structure comprising a silicon germanium layer 34 having a first germanium concentration and an electrically insulating layer 26 adjoining the silicon germanium layer. A hard mask 38 is formed on the silicon germanium layer and then patterned to obtain a structure 44 such as shown in FIG. 5A. A first silicon germanium fin is formed from a portion of the silicon germanium layer beneath the patterned hard mask, as shown in FIG. 5B. Annealing the first silicon germanium fin in an oxidizing ambient results in the formation of a germanium-containing region 52 (or 62) beneath the patterned hard mask having a second germanium concentration higher than the first germanium concentration and an oxide region 54 (or 64) adjoining the germanium-containing region. The oxidizing ambient in the exemplary method contains oxygen ($O_2$). FIGS. 6A and 6B show exemplary structures 50, 60, respectively, including such germanium containing regions. The patterned hard mask is trimmed, thereby forming a hard mask fin 72 adjoining the germanium-containing region 52, as shown schematically in FIG. 7. The method further includes removing the oxide region 54 or 64 adjoining the germanium-containing region and anisotropically etching the germanium-containing region, thereby forming a germanium-containing fin 82 having planar, vertically extending sidewalls. The fin is formed from the germanium-containing region 52 or 62 and accordingly has the second, relatively high, germanium concentration. In one or more embodiments, the step of obtaining the structure comprising the silicon germanium layer having the first germanium concentration and an electrically insulating layer adjoining the silicon germanium layer includes obtaining a silicon-on-insulator structure 20 including a substrate layer 24, a silicon layer 22, and the electrically insulating layer 26, forming an epitaxial silicon germanium layer 28 on the silicon layer as shown in FIG. 2, annealing the epitaxial silicon germanium layer in an oxidizing ambient, thereby forming the silicon germanium layer 34 on the electrically insulating layer 26 and an oxide layer 36 on the silicon germanium layer, and removing the oxide layer 36. The epitaxial silicon germanium layer 28 comprises $Si_{1-x}Ge_x$ where x is less than 0.5 in one or more embodiments. In some embodiments, the germanium-containing region 52 comprises $Si_{1-y}Ge_y$ where y is greater than 0.75. The method may further including the step of selecting a target critical dimension for the germanium-containing fin 82. Patterning the hard mask may include forming a fin pattern having a critical dimension (W) exceeding the target critical dimension, as shown in FIG. 5A. The step of trimming the patterned hard mask causes the hard mask fin 72 to have the target critical dimension of the germanium-containing fin 82 in one or more embodiments. One or more FinFET devices may be formed using the germanium-containing fin. The fabrication methods facilitate the manufacture of finned structures including relatively tall fins having germanium contents that exceed 75% and heights are at least twice the fin widths in one or more embodiments. Fins heights can exceed the critical thickness of a silicon germanium layer having the targeted germanium content grown on silicon.

A further exemplary method for fabricating a finned structure including germanium-containing fins on an electrically insulating layer includes selecting a target critical dimension for a plurality of germanium-containing fins 82, obtaining a structure 40 including a substrate layer, a silicon germanium layer 34 consisting essentially of $Si_{1-x}Ge_x$ where x is less than 0.5, an electrically insulating layer 26 between and adjoining the substrate layer and the silicon germanium layer, and a hard mask 38 directly on the electrically insulating layer, patterning the hard mask 38 to form a hard mask fin pattern having a critical dimension exceeding the target critical dimension, forming an array of parallel first silicon germanium fins from the silicon germanium layer beneath the patterned hard mask, and annealing the first silicon germanium fins in an oxidizing ambient to form germanium-containing regions 52 consisting essentially of $Si_{1-y}Ge_y$ where y is greater than 0.75 and oxide regions 54 adjoining the germanium-containing regions. FIG. 10 shows an exemplary structure 100 including parallel germanium-containing regions having non-planar side walls. The patterned hard mask is trimmed, thereby forming parallel hard mask fins 72 having the target critical dimension and adjoining the germanium-containing regions 52. The oxide regions adjoining the germanium-containing regions are removed and germanium-containing second fins having planar, vertically extending sidewalls and the target critical dimension are formed from the germanium-containing region. Reactive ion etching may be employed to remove both the oxide regions 54 and portions of the germanium-containing regions 52. The target critical dimension in one or more embodiments is a fin width for the germanium-containing second fins 82 of eight (8) nanometers or less. In some embodiments, the electrically insulating layer includes a silicon dioxide layer and a second layer having greater resistance to RIE than silicon dioxide.

An exemplary finned structure includes a substrate layer 24, an electrically insulating layer 26 on the substrate layer, and a plurality of parallel germanium-containing fins 82 on the electrically insulating layer, the fins having vertical, planar side walls and consisting essentially of $Si_{1-y}Ge_y$ where y is between 0.8-1, each of the fins 82 having a width of eight (8) nanometers or less. The fins 82 of the finned structures have the same heights and widths in one or more embodiments. The fin heights are at least twice the fin widths in one or more embodiments.

Those skilled in the art will appreciate that the exemplary structures discussed above can be distributed in raw form or incorporated as parts of intermediate products or end products such as integrated circuits that benefit from having non-planar electronic devices such as FinFETs therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A finned structure comprising:
   a semiconductor substrate layer;
   a continuous electrically insulating layer on the substrate layer, the electrically insulating layer including a bottom surface adjoining the substrate layer and a top surface, and
   a plurality of parallel germanium-containing fins on the top surface of the electrically insulating layer, the electrically insulating layer being positioned between the substrate layer and the fins and electrically insulating the fins from the substrate layer, the fins having vertical, planar side walls extending vertically from the top surface of the electrically insulating layer and, in their entireties, consisting essentially of $Si_{1-y}Ge_y$ where y is between 0.8-1, each of the fins having a width of eight nanometers or less.

2. The finned structure of claim 1, wherein the electrically insulating layer comprises a silicon dioxide layer and a second layer selected from the group consisting of boron nitride, hafnium oxide and aluminum oxide, the fins adjoining the second layer.

3. The finned structure of claim 1, wherein each of the fins has a height exceeding ten nanometers.

4. The finned structure of claim 3, wherein fin pitch is between 25 nm and 100 nm.

5. The finned structure of claim 1, further including a nitride cap on each fin.

6. The finned structure of claim 1, wherein the electrically insulating layer includes an oxide layer.

7. The finned structure of claim 6, wherein the electrically insulating layer is a bilayer including a top layer adjoining the fins and a bottom layer adjoining the top layer, the top layer having greater etch resistance than the bottom layer.

8. The finned structure of claim 1, wherein each of the fins has the same height and width.

9. The finned structure of claim 8, wherein the fin heights are at least twice the fin widths.

10. The finned structure of claim 9, wherein fin pitch is between 25 nm and 100 nm.

11. The finned structure of claim 1, wherein each of the fins has a height exceeding the critical thickness of a silicon germanium layer grown on silicon and having the composition $Si_{1-y}Ge_y$ where y is between 0.8-1.

12. The finned structure of claim 1, wherein the side walls of the fins are without undercuts and vertical and planar throughout their lengths.

13. The finned structure of claim 12, wherein the electrically insulating layer is a bilayer including a top layer adjoining the fins and a bottom layer adjoining the top layer, the top layer having greater etch resistance than the bottom layer.

14. The finned structure of claim 12, wherein the fin heights are at least twice the fin widths.

15. The finned structure of claim 14, wherein the electrically insulating layer includes a buried oxide layer.

\* \* \* \* \*